United States Patent
Becker (10) Patent No.: US 6,738,435 B1
(45) Date of Patent: May 18, 2004

(54) MATCHED-FILTER FREQUENCY-SHIFT-KEYED RECEIVER USING DEGENERATE DIGITAL SIGNAL PROCESSING TECHNIQUES

(75) Inventor: Dean R. Becker, Sarasota, FL (US)

(73) Assignee: Tollgrade Communications, Inc., Wilmington, DE (US)

( * ) Notice: Subject to any disclaimer, the term of this patent is extended or adjusted under 35 U.S.C. 154(b) by 709 days.

(21) Appl. No.: 09/689,684

(22) Filed: Oct. 13, 2000

Related U.S. Application Data
(60) Provisional application No. 60/159,854, filed on Oct. 15, 1999.

(51) Int. Cl.[7] .............................. H04L 27/14; H03D 3/00
(52) U.S. Cl. ......................................... 375/334
(58) Field of Search ................................. 375/334, 335, 375/340, 272

(56) References Cited

U.S. PATENT DOCUMENTS

| | | | | | |
|---|---|---|---|---|---|
| 5,487,186 A | * | 1/1996 | Scarpa | ..................... | 455/192.2 |
| 5,748,036 A | * | 5/1998 | Lee et al. | ................... | 329/300 |

* cited by examiner

Primary Examiner—Stephen Chin
Assistant Examiner—David B. Lugo
(74) Attorney, Agent, or Firm—Michael de Angeli

(57) ABSTRACT

A receiver for frequency shift keyed data transmission implemented using degenerate digital signal processing techniques, whereby complex circuitry can be avoided in favor of low cost, readily manufactuable logic gates.

25 Claims, 6 Drawing Sheets

MATCHED-FILTER FREQUENCY-SHIFT-KEYED RECEIVER USING DEGENERATE DIGITAL SIGNAL PROCESSING TECHNIQUES

CROSS-REFERENCE TO RELATED APPLICATION

This application claims priority from Provisional Application Ser. No. 60/159,854, filed Oct. 15, 1999.

FIELD OF THE INVENTION

This invention relates to a particularly inexpensive and reliably manufacturable circuit for a digital receiver implementing frequency-shift-keyed (FSK) data transmission.

BACKGROUND OF THE INVENTION

Frequency-shift-keyed (FSK) data transmission, in which digital bits are transmitted using a burst of a first frequency for a "1" and a similar burst of a second frequency for a "0", is well known. Typically the "high" tone is used to transmit a "1" (referred to a "mark" in teletype parlance) and the "low" tone to transmit the "0" (or "space"), but the invention is not thus limited. The present invention was implemented in connection with using FSK techniques to perform data transmission between cable television "head end" installations and telemetry transponders, but is not thus limited. It will be appreciated, however, by those of skill in the art that any FSK information forming part of a cable TV signal will by necessity have been transmitted together with literally hundreds of different video and audio signals, and will be subject to interference from innumerable sources, so that the accurate detection and demodulation of the FSK signal requires thorough and complete processing.

Figure 1:
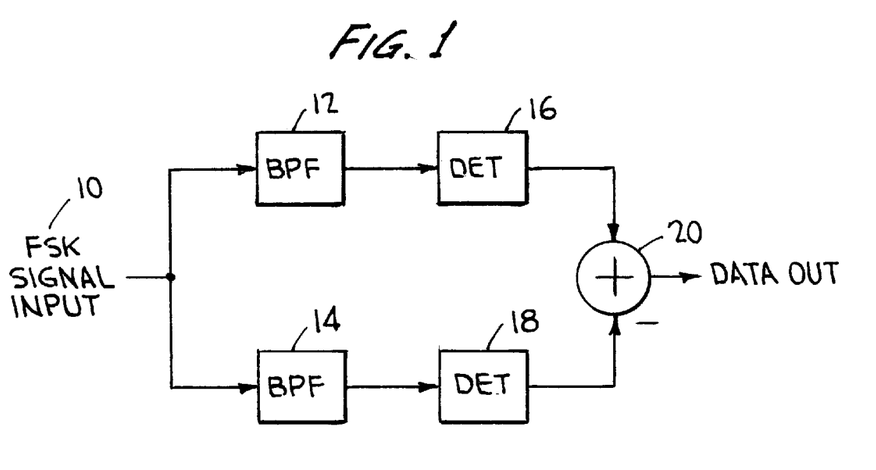
FIG. 1, as discussed above, represents schematically the basic functional components of an FSK receiver.

The basic functions required for an FSK receiver (more particularly, of an optimal receiver for FSK signals having a modulation index>1, as understood by those of skill in the art) are shown in schematic form by FIG. 1. The FSK input signal, consisting of a sequence of tones of two different frequencies (likely mixed with numerous other signals and random noise, as indicated above), is provided at 10; it is split and supplied to two bandpass filters 12 and 14, each optimized to pass either the "high" or "low" tone. Where the filters are optimized to also select for the anticipated shape of the tone pulse, they are referred to as "matched" filters. The outputs from the filters are passed to detectors 16 and 18, which provide output signals the amplitude of which is proportional to the amount of energy passing through the corresponding filter. These output signals are effectively compared in a summing node 20, which is typically arranged to provide a positive output when the energy passing through the filter (e.g., 12) corresponding to the high tone exceeds that passing through the filter (14) corresponding to the low tone, and a negative output when the energy levels are reversed.

Typical techniques for implementing the circuit of FIG. 1 involve complex digital signal processing (DSP) techniques, which require costly and complex circuit components. It is obviously desirable to reduce the cost of receivers (and possibly other devices) implementing FSK techniques insofar as possible.

OBJECTS AND SUMMARY OF THE INVENTION

It is therefore an object of the invention to reduce the cost of FSK receivers, while suffering no performance penalty.

The above object of the invention, and others which will appear below as the discussion proceeds, are met by the present invention. According to the invention, the input signal is mixed with a local oscillator signal chosen so that the intermediate frequency which results bears a specified mathematical relationship to the sampling frequency of an analog-to-digital (A/D) converter used to digitize the input signal. This allows various signal processing functions to be implemented using simple digital logic rather than relatively complex digital multiplication steps, and in turn allows implementation of the circuit at low cost and with high reliability. In-phase and quadrature phase versions of the input signal are processed simultaneously. Phase linear filters are used, which render the output signal as reliable as possible. Further improvements are realized by use of a truncated infinite series to closely approximate non-linear square and square root functions, providing further simplification.

BRIEF DESCRIPTION OF THE DRAWINGS

The invention will be better understood if reference is made to the drawings, in which.

DETAILED DESCRIPTION OF THE PREFERRED EMBODIMENTS

As mentioned above, FIG. 1 shows the basic functions required of an optimal FSK receiver: bandpass filtering of the input signal to separate the high and low tones, followed by corresponding detectors and a difference circuit to measure the relative amplitude of the high and low tones, and thus to discriminate between the frequency being received. The circuit of the present invention provides these functions in a particularly felicitous implementation that allows low-cost manufacture.

More particularly, matched bandpass filters are desirably employed in order to render operation as reliable as possible. Implementing matched filters using digital signal processing (DSP) techniques normally requires relatively extensive and costly circuitry, or a digital computer per se, to perform the complicated multiplication, filtering, and decimating steps involved, as well as square and square-root calculations typically performed to compare the amplitudes of the high and low tones.

According to the present invention, the intermediate frequency to which the input signal is heterodyned before analog to digital (A/D) conversion is performed, the sampling rate at which A/D conversion is performed, and the rate at which decimation is performed as part of the filtering process, are all chosen to bear specific mathematical relations to one another. As shown in the following, this fact allows the complicated mathematical functions mentioned to be performed using simple inverters, adders and registers, which in turn allows the circuit to be implemented using a relatively inexpensive gate array or application-specific integrated circuit (ASIC) chip.

More specifically, by proper choice of the intermediate frequency, the sampling rate, and the decimation rate relative to one another, as above, these and related signal processing functions can be performed such that the coefficients and local oscillator values by which the signal is multiplied in performance of these steps are one of −1, 0, or 1, so that the multiplication step can be accomplished by two's complementing the signal value, setting it to zero, or passing it unaltered, respectively. These "degenerate" processing steps ("degenerate" in the sense that the complete sine and cosine functions are approximated) can be performed using simple logic elements, as mentioned, simplifying the circuit immensely.

Still more specifically, heterodyning of the signal (multiplying it by a local oscillator (LO) signal) is simply performed by a multiplexer, again made possible because the frequency of the LO signal is chosen so that it has a value of −1, 0, or 1 at the sampling intervals. Filters are similarly implemented as integrating accumulators, cascade integrate and comb filters, and sliding windows with coefficients of 1. Finally, non-linear square and square root functions, normally used to measure the magnitude of a complex vector representative of the amount of energy in the "high" or "low" tone, can be approximated with sufficient accuracy using terms from a truncated infinite series, again greatly simplifying the circuitry required.

Figure 2:
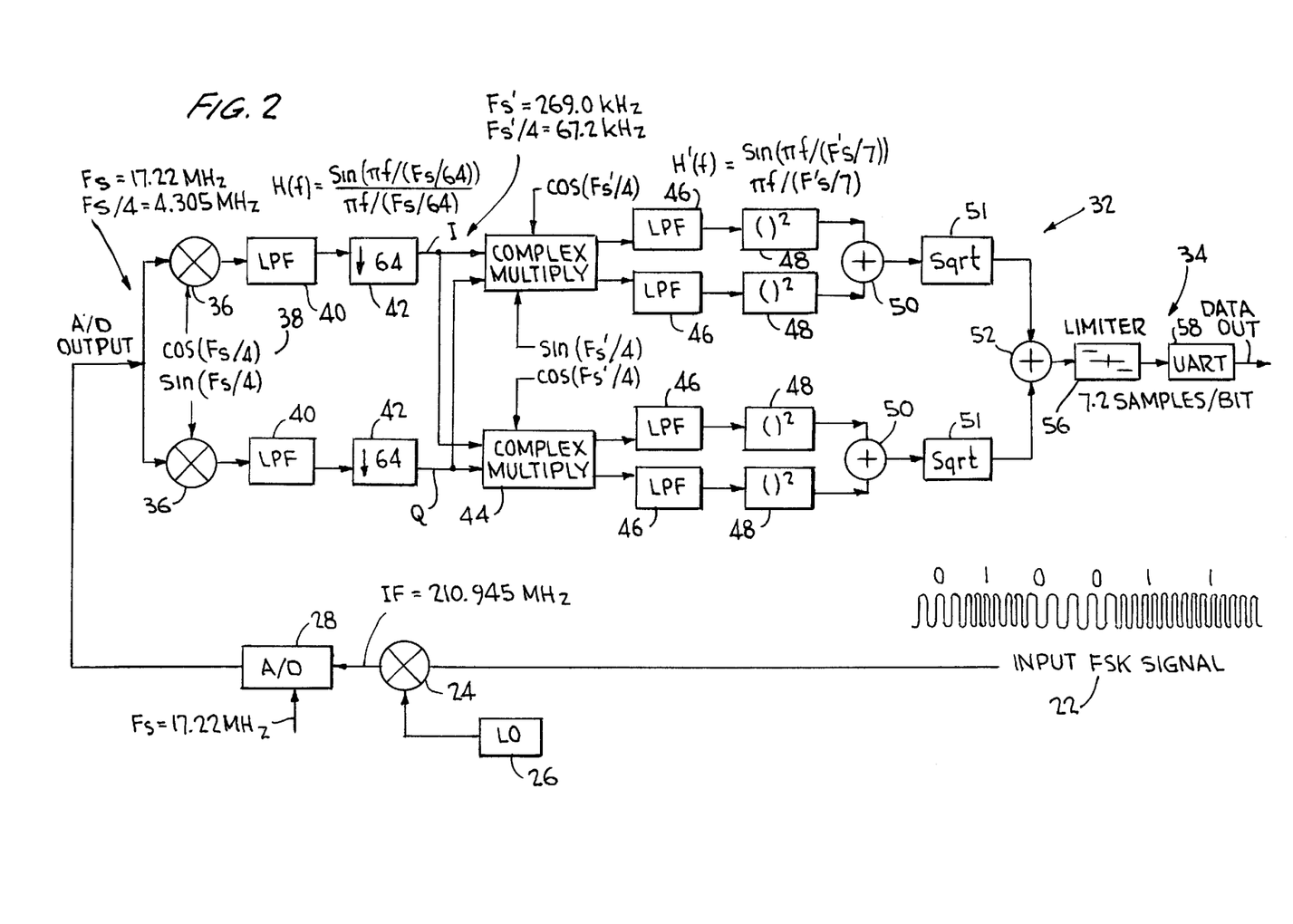
FIG. 2 shows a block diagram of a digital signal processing (DSP) implementation of an FSK receiver according to the invention.

Turning now to detailed discussion of the preferred embodiment of the invention, FIG. 2 shows a block diagram of the circuit of the invention, with FIGS. 3–6 detailing components thereof, and additional information useful in understanding the invention. The input FSK signal is illustrated at 22; as noted above, it simply comprises a series of high and low tones, that is, a series of pulses of two different frequencies, one frequency corresponding to a "1" and the other to a "0", as illustrated. In the example, the length of the FSK pulses is such that they are provided at a frequency of 38.4 kHz, and the high and low tones each are spaced by a "deviation" of 67 kHz from a center frequency.

The input signal is "upconverted" by mixing in a mixer 24 with a local oscillator (LO) signal from a suitable oscillator 26, so that the high and low tones are spaced equally on either side of an intermediate-frequency (IF) signal. After mixing, in the example discussed herein, the high and low tones each are spaced by the deviation of 67 kHz from the intermediate frequency $F_{IF}$, which is chosen to be 210.945 MHz, as indicated. This IF signal is then sampled in an A/D converter 28, at a sample rate Fs of 17.22 MHz, as shown. In this connection, the A/D converter should be chosen for a very short sampling interval; the Harris/Intersil Model HI5767 is suitable.

The relationship between the intermediate frequency $F_{IF}$ and the sample rate Fs obeys the following relation:

$$F_{IF}=(N+0.25)Fs$$

where N is an integer, 12 in the example.

As will be recognized by those of skill in the art, this "undersampling" process results in a series of digital values for the amplitude of the IF signal centered at Fs/4.

This series of input samples is then provided to the FSK demodulation circuit itself 32, which conforms functionally to that of FIG. 1. That is, the upper "channel" of the circuit shown at 32 in FIG. 2 (more particularly, comprising components 44, 46, 48, 50, and 51) shows the circuit components that extract a value responsive to the amount of energy at the "high" frequency, and the mirror-imaged lower channel includes the corresponding components extracting a value for the amount of energy at the "low" frequency; comparing their respective outputs at 34 yields the series of bits sought. In the following, after description of certain "front end" functions, the operation of the upper "high" side of the circuit is described; the operation of the lower side is similar, with exceptions noted as appropriate.

Referring now to the "front end" processes mentioned, the input signal is first heterodyned to dc, by being mixed at 36 by sin(Fs/4) and cos(Fs/4) signals provided by a local oscillator set to Fs/4, as indicated at 38. The mixing process results in in-phase (I) and quadrature phase (Q) components being available, centered at dc.

Figure 5A:
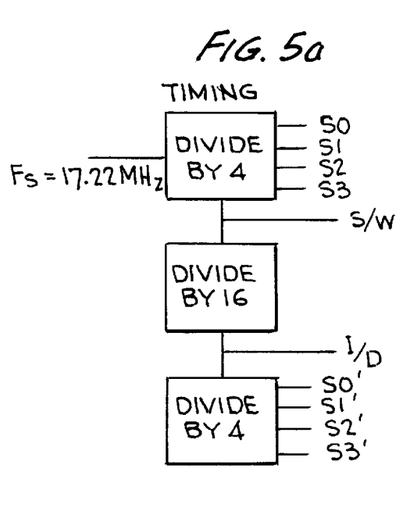
FIG. 5(a) shows a timing circuit used to sequence operation of the circuit.
Figure 5B:
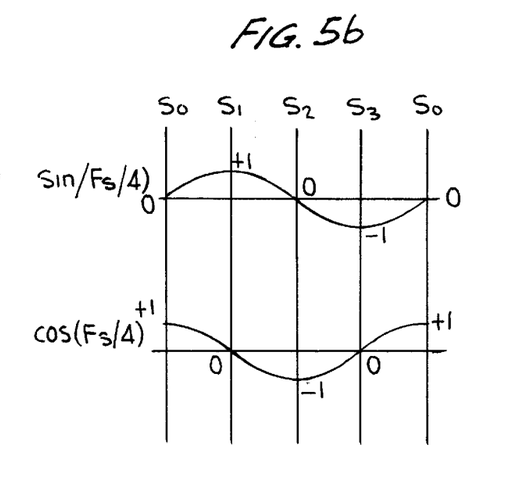
FIG. 5(b) shows sine and cosine waves, with reference to the signals provided by the circuit of FIG. 5(a)
Figure 5C:
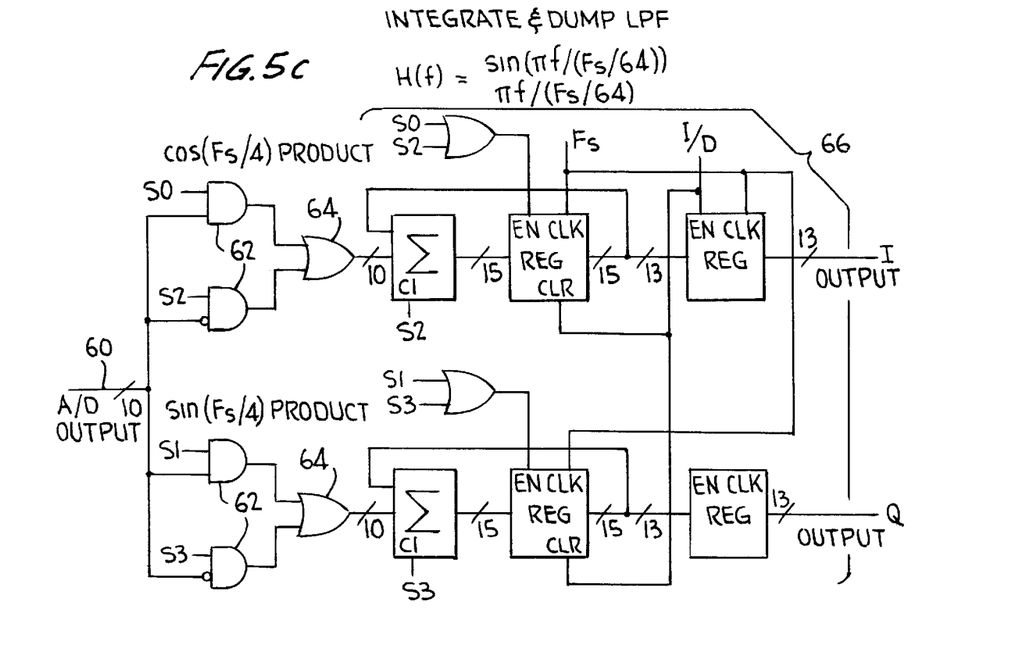
FIG. 5(c) shows the circuitry used for complex conversion of the signal followed by an "integrate and dump" low-pass filter also used to decimate the input signal.

According to an important aspect of the invention, the mixing step carried out at 36 is performed using logic circuitry rather than multiplication per se; that is, the LO signal frequency is chosen to match the aliased sampling frequency, i.e., Fs/4, so that the coefficients corresponding to the sine and cosine functions at the sampling intervals are −1, 0, and 1, so that the sample need simply be two's complemented, set to zero, or passed unaltered in order for the mixing step to take place. FIG. 5(b) shows the sine and cosine waveforms, to make this clear; FIG. 5(c), which is discussed in detail below, shows in its left side the logic circuitry performing the mixing operation, and FIG. 5(a) a relevant timing circuit.

As shown in FIG. 5(b), both the sine and cosine functions pass through zero twice per cycle, and reach values of −1 and 1 between zero crossings. Accordingly, if the multiplication of a signal by the sine or cosine amounts to multiplication of a digital value of the signal taken at a sampling time $S_0, S_1, S_2, S_3, S_0, \ldots$, by the corresponding value of the sine or cosine at that time, it suffices to simply two's complement the signal to effectuate multiplication by −1, set the sample to zero for multiplication by zero, and pass it through unaltered for multiplication by 1. These steps can be readily implemented in simple logic circuitry, and this fact is critical to the significant economies offered by the circuit of the invention. Stated differently, setting the frequency of the local oscillator used to provide the sine and cosine signals to Fs/4 allows use of "degenerate" versions of the sine and cosine waveforms, as above, and greatly simplifies implementation of the FSK receiver according to the invention.

Following complex conversion to dc as above, the I and Q signals are low-pass filtered at 40 and decimated (i.e., a series of values are effectively averaged, to reduce processing requirements downstream) at 42. The low pass filters are shown in the right side of FIG. 5(c), and are discussed below. The purpose of this low-pass filtering step is to eliminate the sum products of the multiplication steps carried out at 36. That is, the multiplication steps, involving as they do multiplication of the input signal by a sine or cosine signal, result in sum and difference values: only the difference value is of interest.

As will be apparent to those of skill in the art upon examination of the detailed circuitry of the filter shown by FIG. 5(c), and as shown by the legend on FIG. 2, the filter is a finite impulse response averaging type, implementing a sin(x)/x function H(f), corresponding to the frequencydomain version of the tone pulses. The filter and decimate circuitry is also referred to as an "integrate and dump" filter, as indicated by the legend on FIG. 5(c). Again, all filter coefficients are set to 1; as above, using this degenerate form of the sin(x)/x function significantly simplifies the circuitry involved. In the commercial implementation of the circuit, a "cascade integrate and comb" filter, well known to those of skill in the art, but not shown in the FIGS. hereof, may also be implemented.

The decimation function indicated at 42 of FIG. 2, whereby the filtered samples are effectively averaged, is performed by the circuit shown on the rightmost portion of FIG. 5(c). In this process, the sample rate Fs is reduced to Fs', related to Fs as follows:

$$Fs'=Fs/M$$

where M is an integer. In the example, M=64. According to an important aspect of the invention, Fs' is chosen so that Fs'/4 is approximately equal to the deviation of each of the tones from the center frequency, in this case 67 KHz. The choice of Fs' as above is made such that the null of the sin(x)/x filter for each channel is at the center of the tone for the other channel, maximizing the effectiveness of the filter. In the example, Fs'=269.0 kHz and Fs'/4=67.2 kHz.

Figure 3:
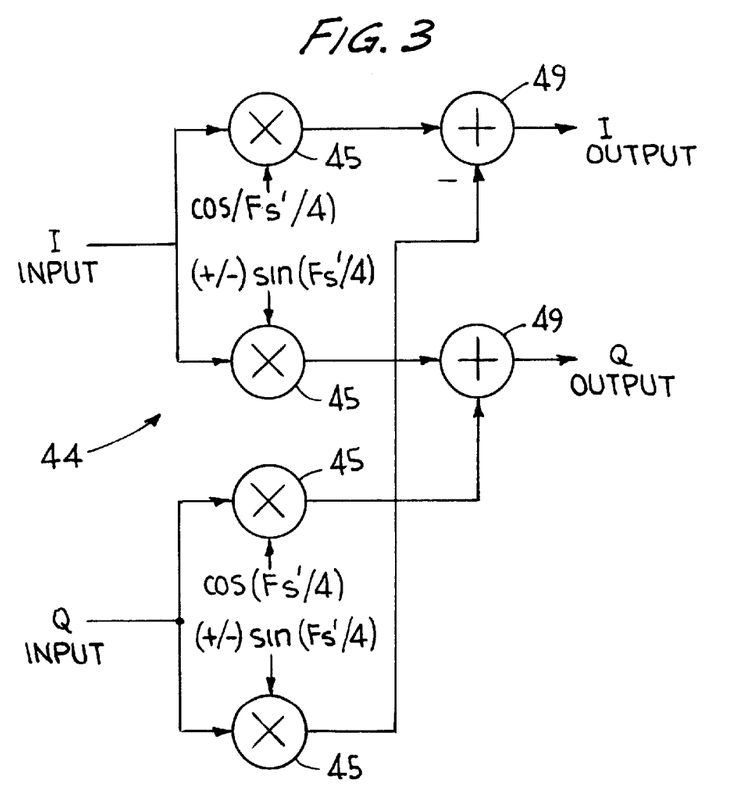
FIG. 3 shows a block diagram of one of two complex multipliers used in the FSK receiver of the invention.
Figure 4A:
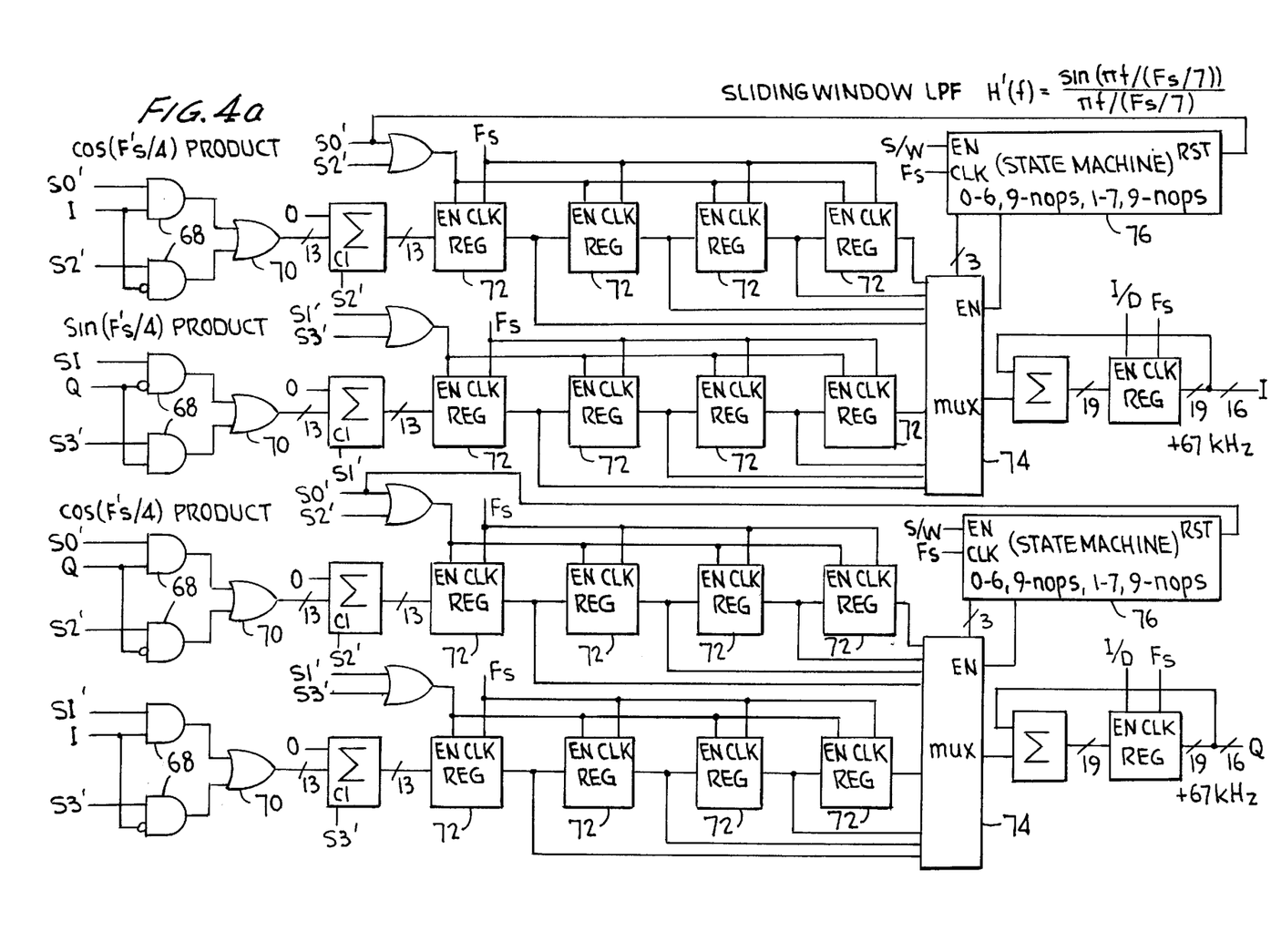
FIG. 4(a) shows a detailed diagram of the complex multiplier and filter used for processing the high tone.

The decimated I and Q signals thus provided are then subjected to two complex multiplication steps indicated at 44. The complex multiplication steps may be considered to define the beginning of the two parallel processing channels corresponding to FIG. 1. The complex multiplication steps 44 each provide I and Q signals that are later analyzed to measure their relative energy, and thus demodulate the FSK signal. The I and Q products of each complex multiplication step are again subjected to another stage of low-pass filtering, at 46, in order to provide the matched filtering function. This filtering step again employs a sin(x)/x function H' (f), as indicated. The complex multiplication step for the upper channel is carried out as shown in FIG. 3; a corresponding process is provided in the lower channel. As indicated in FIG. 3, the I and Q input signals provided from the "front end" mixing step 36 are each employed as input signals to two multipliers 45, in which they are mixed with LO sine and cosine signals at Fs'/4. Again, degenerate LO signals are sufficient, so that simple components can be employed to implement the multiplication step. (The "(+/−)" indication preceding the sin(Fs'/4) indications in FIG. 3 indicate that the sign applied to the sin(Fs'/4) signal varies between the channels; the positive sign corresponds to the upper channel and the negative to the lower, as indicated by FIGS. 4(a) and (b)). The results of these four multiplication steps per channel are then combined in summing nodes 49, yielding I and Q outputs for both channels, again as indicated in FIG. 3. FIGS. 4(a) and (b) illustrate preferred embodiments of the complex multiplier circuits of FIG. 3 in detail.

The I and Q output signals from the low-pass filters 46 of, for example, the upper channel together represent the relative amplitude of the "high" tone. In order to compare the energy of the high and low tones in the input signal, and thus demodulate the FSK signal, the power of the signal in each channel is evaluated and the two values are compared. The power for a complex signal can be accurately evaluated by treating the I and Q phasors as orthogonal vectors, and measuring the power as the length of the resultant vector. This length is conveniently calculated by squaring each of the vectors at 48, summing the squares at 50, and taking the square root of the sum at 51; this of course amounts to an application of Pythagoras' Theorem.

According to another aspect of the present invention, the cost of the hardware components of the circuit is reduced by calculating the power of the phasors using simple approximations for the squaring, summing and square root steps. The approximations are the first terms of infinite series expansions of the processes. Specifically, the approximate expressions are as follows:

If $|I|>|Q|$, then $$P=[|I|+|Q/2|]*15/16$$

Conversely,

If $|I|<|Q|$, then $$P=[|Q|+|I/2|]*15/16$$

This approximation has less than 2% error as compared to the full calculation of the squares and square roots, i.e., $P=(I^2+Q^2)$. Furthermore, as the eventual purpose is to compare the output signals from the two signals to one another, the multiplication by 15/16 of each can be dispensed with.

One of the resultant values for the power of the high and low tones is then subtracted from the other in a summing node 52, to compare the relative power. Specifically, the power in the low tone is subtracted from that of the high tone, resulting in an antipodal signal that if positive represents receipt of a sample indicative of a FSK pulse corresponding to a digital "1" and if negative receipt of a sample corresponding to a digital "0".

The final steps are limiting the dynamic range of the signal in a limiter 56—essentially considering only the sign of the result of the preceding step—and employing a UART (universal asynchronous receiver/transmitter) 58 to respond to the sequence of samples by generating a properly shaped and spaced series of bits. As indicated in FIG. 2, 7.2 samples correspond to each resultant bit in the example discussed.

Referring now to certain details of the preferred implementation of the circuit of the invention: As mentioned above, FIG. 5(a) shows schematically a simple timing circuit used to generate four timing signals $S_0$, $S_1$, $S_2$, $S_3$, $S_0$, ..., which bear the relationship to the local oscillator signals provided by oscillator 38 as input to the mixers 36 illustrated by FIG. 5(b), and four more timing signals $S_0'$, $S_1'$, $S_2'$, $S_3'$, $S_0'$, ..., used as clock signals to the complex multipliers 44, which operate at the decimated rate Fs', as illustrated in FIGS. 4(a) and (b). In FIG. 5(a), the legend "S/W" refers to a clocking signal provided to the sliding window filters 46 of FIGS. 4(a) and (b), and the legend "I/D" to a signal provided to the integrate and dump filter 40 of FIG. 5(c).

FIG. 5(c) shows the "front end" components of FIG. 2 in detail, in which the output series of digital samples from A/D 28 are mixed with sin(Fs/4) and cos(Fs/4) signals, resulting in I and Q signals, which are then low-pass filtered in the integrate and dump filters 40, and decimated. As illustrated, signals $S_0$, $S_1$, $S_2$, $S_3$, $S_0$, ..., are used to clock logic gates implementing the mixing step illustrated by mixers 36 in FIG. 2, the low-pass filtering step illustrated thereon by 40, and the decimation step shown at 42. Specifically, the sequence of digital samples provided by A/D 28 are provided at 60. In this example, ten-bit samples are provided; each is supplied to one of ten identical logic circuits (one being shown in FIG. 5(c)), as indicated by the legends in FIG. 5(c). Signals $S_0$, $S_1$, $S_2$, $S_3$, $S_0$, ..., are supplied to four AND gates 62 by the timing circuit of FIG. 5(a), which in turn feed two OR gates 64; as above, according to an important aspect of the invention, this amounts to mixing the input samples with the sin(Fs/4) and cos(Fs/4) local oscillator signals.

The resulting products are supplied to further logic gates 66 illustrated by FIG. 5(c), which implement the "integrate and dump" low-pass filter providing a sin(x)/x transfer function, and the decimation step. The overall effect of these gates is to average the 64 preceding sample values for the difference result of the mixing step, and provide an output value representative thereof. As indicated, the mixing steps and the gates which follow provide I and Q output signals at the Fs' rate, which are then supplied to the complex multiplier circuits shown schematically in FIG. 3 and in detail in FIGS. 4(a) and (b).

Figure 4B:
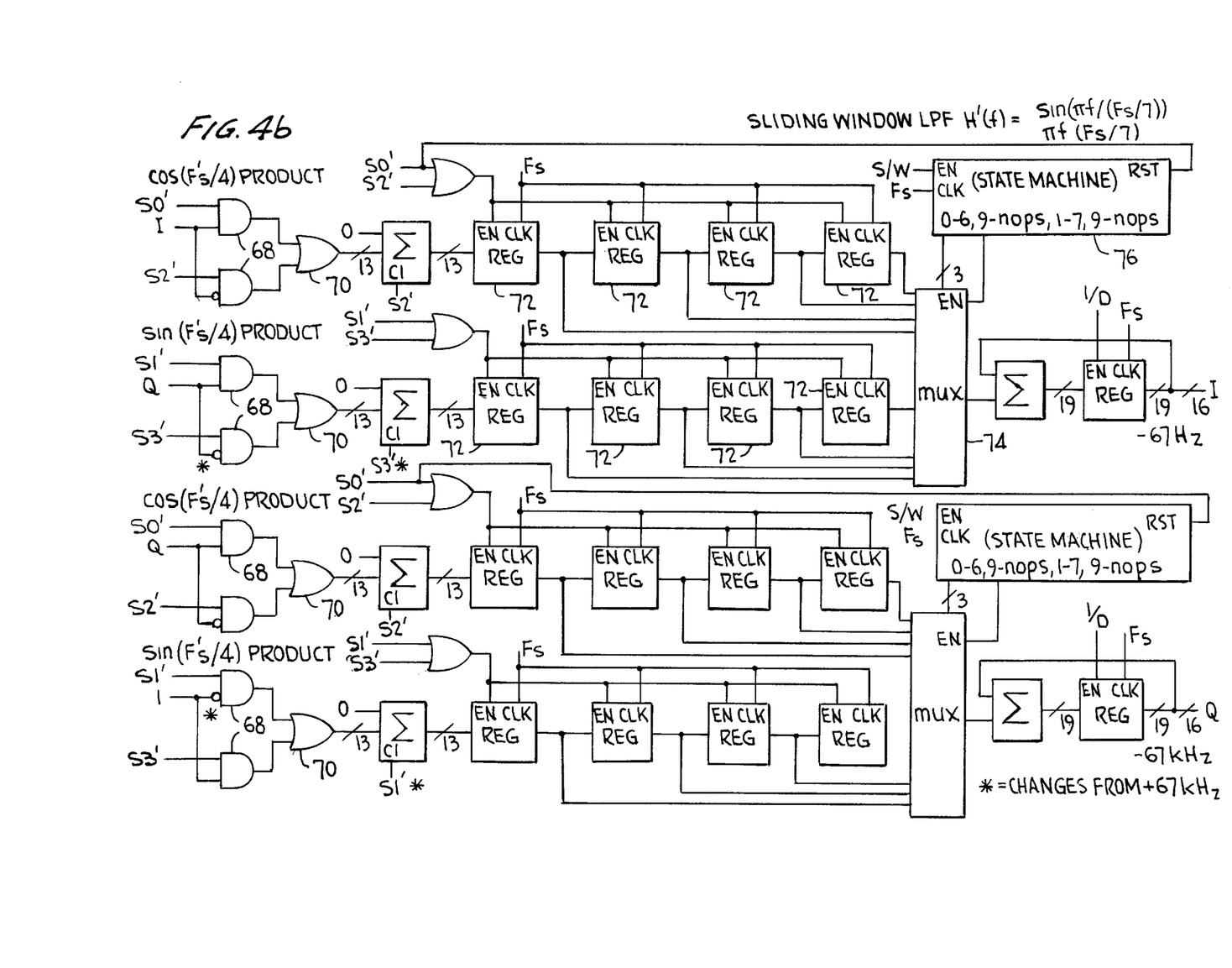
FIG. 4(b) shows a similar diagram for the multiplier used for the low tone.

More specifically, FIG. 4(a) shows the complex multiplier circuit 44 and the two low pass filter circuits 46 for the high tone channel, while FIG. 4(b) shows the corresponding circuits for the low tone channel. As will be apparent, the circuits are nearly identical, with differences being indicated by asterisks in FIG. 4(b). As in the case of FIG. 5(c), both show the logic for a single bit; in actual implementation duplicate circuitry is provided for each bit of the sample.

Referring to FIG. 4(a), each complex multiplier circuit is implemented by pairs of AND gates 68 followed by OR gates 70, multiplying the input signals by the degenerate sin(Fs'/4) and cos(Fs'/4) signals, as indicated. That is, the multiplication process is performed as in FIG. 5, although in the FIG. 4 case the process is clocked by signals $S_0'$, $S_1'$, $S_2'$, $S_3'$, $S_0'$, ..., reflecting the fact that the signal has been decimated. The succeeding low-pass filter is implemented by registers 72, connected as shown, and multiplexer 74, controlled by state machine 76. State machine 76 and multiplexer 74 together implement the sliding window filter, wherein the last several values of the signal samples stored in registers 72 are summed. It will be appreciated by those of skill in the art that these components (and those also shown but not discussed specifically herein) can readily be operated so as to provide a sliding window low-pass filter implementing the sin(x)/x function shown.

Figure 6:
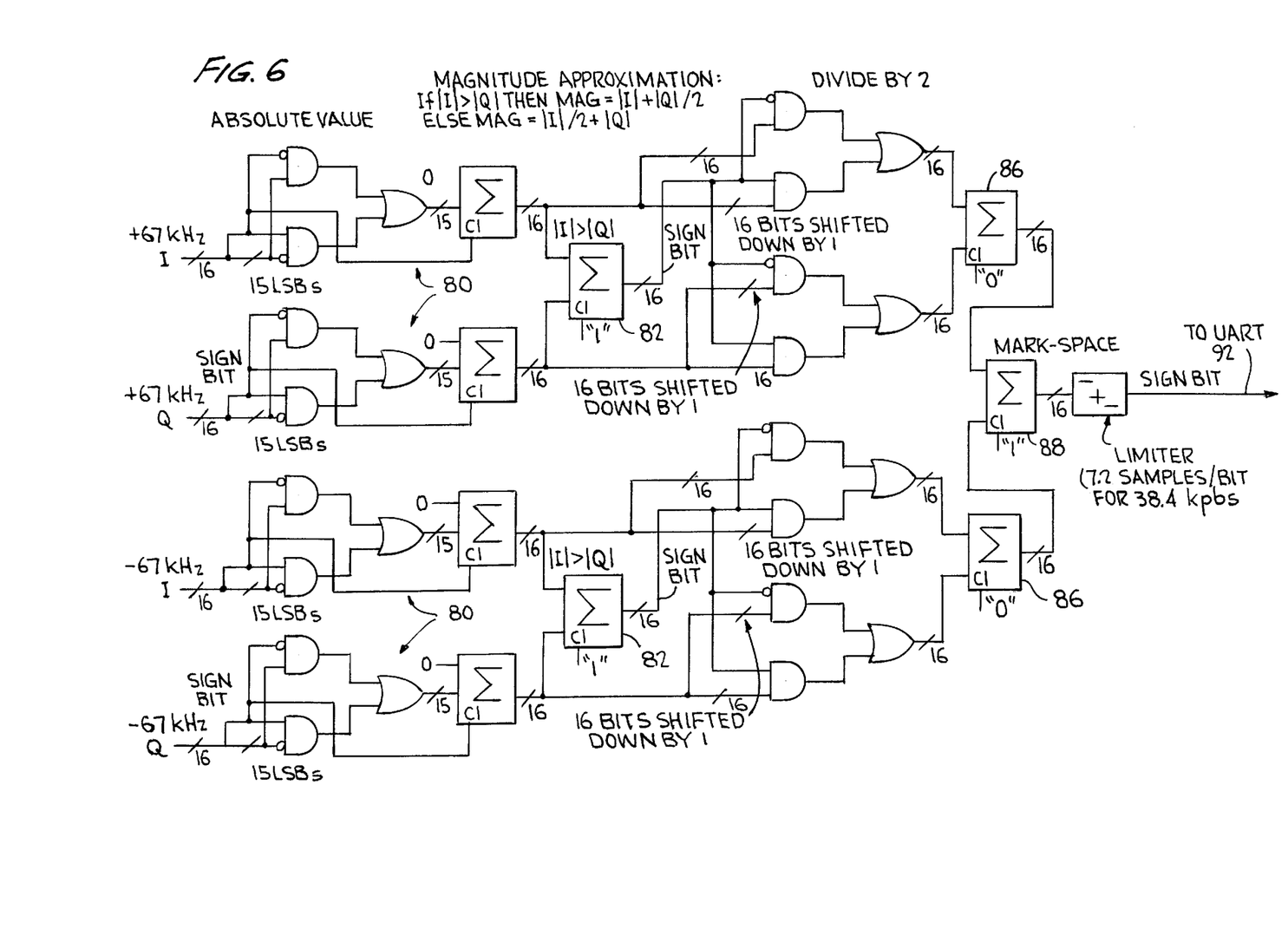
FIG. 6 shows a circuit used to compare the relative amplitudes of the high and low tones, and thus to complete demodulation of the input signal.

FIG. 6 shows, as mentioned, the preferred implementation of the circuitry which implements the comparison between the amount of energy in the high and low channels, as above. (As in the case of FIGS. 4(a) and (b) and FIG. 5(c), FIG. 6 shows the circuitry for a single bit; the same circuitry is multiplied by the number of bits in the sample.) More specifically, the power in each channel is measured using an approximation to Pythagoras' Theorem, so as to avoid the square and square-root calculations required thereby. The approximation employed involves evaluation of the first terms of infinite series providing the same calculations. Thus, the FIG. 6 circuitry evaluates the power P in each channel by evaluating the conditions If $|I|>|Q|$, then $P=|I|+|Q/2|$ Conversely, If $|I|<|Q|$, then $P=|Q|+|I/2|$ with respect to the in-phase signal I and quadrature phase signal Q for both channels; the relative values for the power P in each channel are then simply compared to provide a sample value indicative of the corresponding FSK bit. As mentioned above, a UART compares a series of samples in order to provide the demodulated FSK bit stream.

As indicated by the legends in FIG. 6, the I and Q signals from the high channel (marked "+67 kHZ" in FIG. 6) and from the low channel (similarly marked "−67 kHz", corresponding to the low tone being 67 kHz below the center frequency) are supplied to four similarly-connected sets of two AND gates, an OR gate, and a summing node, all indicated generally at 80. As can be appreciated, the sign bit is removed and used to gate the summing node, thus taking the absolute value of the input I and Q signals. A further summing node 82 for each channel determines whether $|I|>|Q|$ or vice versa; the lesser quantity is divided by two in the following set of gates 84, and added to the larger in a summing node 86, resulting in the calculation of the power in the respective channel. The two respective power values are then compared in a further summing node 88, and used to provide the output signal, which is gain limited at 90, i.e., only the sign bit is supplied to a UART at 92, completing the processing required.

Having now described the invention in detail, it will be appreciated by those of skill in the art that quite sophisticated processing steps have been implemented using comparatively simple and inexpensive circuitry, namely simple binary gates and registers. This is made possible in the first instance by the judicious choice of the relative intermediate frequency, sampling frequency, and decimation rate, and further by employment of an approximate expression for the power in each channel.

It will likewise be appreciated by those of skill in the art that although the specific circuit exemplified by the numerical examples provided is limited to decoding of FSK signals of specific deviation and bit rate, the circuit could readily be adapted to signals exhibiting other parameters, using the teachings herein. Therefore, while a specific example has been explained in detail, the invention is not to be thus limited, but is limited only by the following claims.

What is claimed is:

1. A method for demodulating frequency shift keyed (FSK) signals comprising pulses of different frequencies each. spaced by a deviation from a center frequency in an input waveform, comprising the steps of:

providing a local oscillator signal;

mixing the input waveform with said local oscillator signal, resulting in an intermediate-frequency (IF) signal at a frequency $F_{IF}$;

employing an analog-to-digital converter to provide digital samples of said IF signal at a sampling rate Fs, wherein $F_{IF}$=(N+0.25) Fs, where N is an integer, such that the samples of the FSK signal are centered at Fs/4;

providing a second local oscillator signal having a frequency of Fs/4;

mixing the second local oscillator signal with the sampled signal, thus heterodyning the sampled signal to dc, and providing complex in-phase and quadrature phase signals I and Q corresponding thereto;

wherein said mixing step is performed by evaluating said second local oscillator signal at sample intervals $S_0$, $S_1$, $S_2$, $S_3$, $S_0$, ..., such that the value of said second local oscillator signal is either −1, 0, or 1, and two's complementing, setting to zero, or passing unaltered the corresponding sample, respectively;

low-pass filtering and decimating said I and Q signals, such that a second set of samples is produced at a second sampling rate Fs', wherein Fs'=Fs/M, and wherein Fs'/4 is approximately equal to the deviation of said FSK pulses;

wherein said steps of low-pass filtering and decimating said I and Q signals are performed by evaluating said second set of samples at sample intervals $S_0$, $S_1$, $S_2$, $S_3$, $S_0$, ..., such that the values of the filter and decimating coefficients are either −1, 0, or 1, and two's complementing, setting to zero, or passing unaltered the corresponding sample, respectively;

processing the decimated signals in two parallel channels, each deriving values for the power of one of the high or low FSK tones;

wherein the steps performed in said parallel channels include:

performing complex multiplication of the I and Q signals for each channel by cos(Fs'/4) and sin(Fs'/4) signals, wherein said step of performing complex multiplication are performed by evaluating said cos(Fs'/4) and sin(Fs'/4) signals at sample intervals $S_0'$, $S_1'$, $S_2'$, $S_3'$, $S_0'$, ..., such that the values thereof are either −1, 0, or 1, and two's complementing, setting to zero, or passing unaltered the corresponding sample, respectively;

low-pass filtering the signals resulting from said complex multiplication, by evaluating said signals resulting from said complex multiplication at sample intervals $S_0'$, $S_1'$, $S_2'$, $S_3'$, $S_0'$, ..., such that the coefficients of the filter are either −1, 0, or 1, and two's complementing, setting to zero, or passing unaltered the corresponding sample, respectively; and evaluating the power of the signals in each of said channels;

comparing the values of the power of the signals in each of said channels; and providing an output series of bits responsive to the result of said comparison step.

2. The method of claim 1, wherein said low-pass filtering steps are performed by filtering using a sin(x)/x function, whereby a matched filtering step is provided.

3. The method of claim 1, wherein said step of evaluating the power of the signals in each of said channels is performed by comparing the absolute value of the I and Q signals to one another, and implementing the following:

If |*I*|>|*Q*|, then

*P*=|*I*|+|*Q*/2|

Conversely,

If |*I*|<|*Q*|, then

*P*=|*Q*|+|*I*/2| and comparing the values for P thus determined with respect to the two channels.

4. A method for demodulating frequency shift keyed (FSK) signals comprising pulses of different frequencies each spaced by a deviation from a center frequency in an input waveform, comprising the steps of:

providing a local oscillator signal at a frequency $F_{IF}$;

detecting the input waveform and mixing said local oscillator signal therewith, resulting in an intermediate-frequency (IF) signal;

employing an analog-to-digital converter to provide digital samples of said IF signal at a sampling rate Fs, wherein $F_{IF}$=(N+0.25) Fs, where N is an integer, such that the samples of the FSK signal are centered at Fs/4;

providing a second local oscillator signal having a frequency of Fs/4;

mixing the second local oscillator signal with the sampled signal, thus heterodyning the sampled signal to dc, and providing complex in-phase and quadrature phase signals I and Q corresponding thereto;

low-pass filtering and decimating said I and Q signals, such that a second set of samples is produced at a second sampling rate Fs', wherein Fs'=Fs/M, wherein M is an integer representing the decimation rate and wherein Fs'/4 is approximately equal to the deviation of said FSK pulses;

processing the decimated signals in two parallel channels, each deriving values for the power of one of the high or low FSK tones;

wherein the steps performed in said parallel channels include:

performing complex multiplication of the I and Q signals for each channel by cos(Fs'/4) and sin(Fs'/4) signals, low-pass filtering the signals resulting from said complex multiplication, and evaluating the power of the signals in each of said channels;

comparing the values of the power of the signals in each of said channels; and providing an output series of bits responsive to the result of said comparison step.

5. The method of claim 4, where said step of mixing the second local oscillator signal with the sampled signal is performed employing logic gates to implement degenerate multiplication of the input signal with the second local oscillator signal.

6. The method of claim 5, wherein said step of mixing the second local oscillator signal with the sampled signal is performed by evaluating said input signal at sample intervals $S_0$, $S_1$, $S_2$, $S_3$, $S_0$, ..., such that the value of said second local oscillator signal is either −1, 0, or 1, and two's complementing, setting to zero, or passing unaltered the corresponding sample of the input signal, respectively.

7. The method of claim 4, where said steps of low-pass filtering and decimating said I and Q signals are performed employing logic gates to implement degenerate filtering and decimation of said I and Q signals.

8. The method of claim 7, wherein said steps of low-pass filtering and decimating said I and Q signals are performed by evaluating said second set of samples at sample intervals $S_0$, $S_1$, $S_2$, $S_3$, $S_0$, ..., such that the values of the filter and decimating coefficients are either −1, 0, or 1, and two's complementing, setting to zero, or passing unaltered the corresponding sample of the respective signal, respectively.

9. The method of claim 4, wherein said step of performing complex multiplication is performed employing logic gates to implement degenerate multiplication of the input signal with said cos(Fs'/4) and sin(Fs'/4) signals.

10. The method of claim 9, wherein said step of performing complex multiplication is performed by evaluating said cos(Fs'/4) and sin(Fs'/4) signals at sample intervals $S_0'$, $S_1'$, $S_2'$, $S_3'$, $S_0'$, ..., such that the values thereof are either −1, 0, or 1, and two's complementing, setting to zero, or passing through the corresponding sample of the input signal, respectively.

11. The method of claim 4, wherein said step of low-pass filtering the signals resulting from said complex multiplication is performed employing logic gates to apply degenerate filter coefficients thereto.

12. The method of claim 11, wherein said step of low-pass filtering the signals resulting from said complex multiplication is performed by evaluating said signals resulting from said complex multiplication at sample intervals $S_0'$, $S_1'$, $S_2'$, $S_3'$, $S_0'$, ..., and applying filter coefficients of either −1, 0, or 1 thereto by two's complementing, setting to zero, or passing unaltered the corresponding sample, respectively.

13. The method of claim 4, wherein said low-pass filtering steps are performed by filtering using a sin(x)/x function, whereby a matched filtering step is provided.

14. The method of claim 4, wherein said step of evaluating the power of the signals in each of said channels is performed by comparing the absolute value of the I and Q signals to one another, and implementing the following:

If $|I|>|Q|$, then $P=|I|+|Q/2|$

Conversely,

If $|I|<|Q|$, then $P=|Q|+|I/2|$.

15. A receiver for demodulating frequency shift keyed (FSK) signals comprising pulses of different frequencies each spaced by a deviation from a center frequency in an input waveform, comprising:

a local oscillator signal providing a signal at a frequency $F_{IF}$;

a mixer for mixing the input waveform with said local oscillator signal, resulting in an intermediate-frequency (IF) signal;

an analog-to-digital converter providing digital samples of said IF signal at a sampling rate Fs, wherein $F_{IF}=$ (N+0.25) Fs, where N is an integer, such that the samples of the FSK signal are centered at Fs/4;

a second local oscillator providing a second local oscillator signal of frequency Fs/4;

a mixer for mixing the second local oscillator signal with the sampled signal, thus heterodyning the sampled signal to dc, and providing complex in-phase and quadrature phase signals I and Q corresponding thereto;

circuit components for low-pass filtering and decimating said I and Q signals, such that a second set of samples is produced at a second sampling rate Fs', wherein Fs'=Fs/(M*4), wherein M is an integer representing the decimation rate and wherein Fs'/4 is approximately equal to the deviation of said FSK pulses;

circuit components defining two parallel signal processing channels, each deriving values for the power of one of the high or low FSK tones;

wherein the circuit components defining each said parallel channels include:

complex multipliers for performing complex multiplication of the I and Q signals for each channel by cos(Fs'/4) and sin(Fs'/4) signals, filters for low-pass filtering the signals resulting from said complex multiplication, and calculation components for evaluating the power of the signals in each of said channels;

comparison means for comparing the values of the power of the signals in each of said channels; and means for providing an output series of bits responsive to the result of said comparison step.

16. The reciever of claim 15, where said mixer for mixing the local oscillator signal with the sampled signal employs logic gates to implement degenerate multiplication of the input signal with the local oscillator signal.

17. The reciever of claim 16, wherein said mixer for mixing the local oscillator signal with the sampled signal evaluates said input signal at sample intervals $S_0, S_1, S_2, S_3, S_0, \ldots$, such that the value of said second local oscillator signal is either −1, 0, or 1, and two's complements, sets to zero, or passing unaltered the corresponding sample of the input signal, respectively.

18. The reciever of claim 15, wherein said circuit components for low-pass filtering and decimating said I and Q signals comprise logic gates to implement degenerate low-pass filtering and decimation of said I and Q signals.

19. The reciever of claim 18, wherein said circuit components for low-pass filtering and decimating said I and Q signals evaluate said second set of samples at sample intervals $S_0, S_1, S_2, S_3, \ldots$, such that the values of the filter and decimating coefficients are either −1, 0, or 1, and two's complement, set to zero, or passing unaltered the corresponding sample of the respective signal, respectively.

20. The reciever of claim 15, wherein said complex multipliers employ logic gates to implement degenerate multiplication of the input signal with said cos(Fs'/4) and sin(Fs'/4) signals.

21. The reciever of claim 20, wherein said complex multipliers evaluate said cos(Fs'/4) and sin(Fs'/4) signals at sample intervals $S_0', S_1', S_2', S_3', S_0', \ldots$, such that the values thereof are either −1, 0, or 1, and two's complement, set to zero, or passing unaltered the corresponding sample of the input signal, respectively.

22. The reciever of claim 15, wherein said low-pass filters operating on the signals resulting from said complex multiplication employ logic gates to apply degenerate filter coefficients thereto.

23. The reciever of claim 22, wherein said low-pass filters evaluate said signals resulting from said complex multiplication at sample intervals $S_0', S_1', S_3', S_0', \ldots$, and apply filter coefficients of either −1, 0, or 1 thereto by two's complementing, setting to zero, or passing unaltered the corresponding sample, respectively.

24. The reciever of claim 15, wherein said low-pass filters implement a sin(x)/x function, whereby matched filters are provided.

25. The reciever of claim 15, wherein said calculation components for evaluating the power of the I and Q signals in each of said channels compare the absolute value of the I and Q signals to one another, and implement the following:

If $|I|>|Q|$, then $P=|I|+|Q/2|$

Conversely,

If $|I|<|Q|$, then $P=|Q|+|I/2|$.

* * * * *